(12) United States Patent
Xie et al.

(10) Patent No.: US 7,635,915 B2
(45) Date of Patent: Dec. 22, 2009

(54) APPARATUS AND METHOD FOR USE IN MOUNTING ELECTRONIC ELEMENTS

(75) Inventors: Jian Hui Xie, Guangdong (CN); Siu Cheong Cheng, Hong Kong (CN)

(73) Assignee: Cree Hong Kong Limited, Hong Kong (CN)

(*) Notice: Subject to any disclaimer, the term of this patent is extended or adjusted under 35 U.S.C. 154(b) by 373 days.

(21) Appl. No.: 11/380,402

(22) Filed: Apr. 26, 2006

(65) Prior Publication Data

US 2007/0252250 A1    Nov. 1, 2007

(51) Int. Cl.
   *H01L 23/48*   (2006.01)
(52) U.S. Cl. ............... 257/692; 257/696; 257/E23.043; 257/E23.06
(58) Field of Classification Search ............ 257/81, 257/99, 100, 433, 687, 672, 696, E23.042, 257/E23.043, E23.06, E33.066, 692
See application file for complete search history.

(56) References Cited

U.S. PATENT DOCUMENTS

| | | | |
|---|---|---|---|
| 3,760,237 A | 9/1973 | Jaffe | 257/98 |
| 4,307,297 A | 12/1981 | Groff | |
| 4,511,425 A | 4/1985 | Boyd | 156/493 |
| 5,040,868 A | 8/1991 | Waitl | |
| 5,130,761 A | 7/1992 | Toshiaki | 357/17 |
| 5,167,556 A | 12/1992 | Stein | |
| 5,703,401 A | 12/1997 | Van de Water | |
| 5,706,177 A | 1/1998 | Nather | |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,959,316 A | 9/1999 | Lowery | 257/98 |
| 6,061,160 A | 5/2000 | Maruyama | 359/152 |
| 6,066,861 A | 5/2000 | Hohn et al. | |

(Continued)

FOREIGN PATENT DOCUMENTS

CN    1581527 A    2/2005

(Continued)

OTHER PUBLICATIONS

U.S. Appl. No. 11/277,717, filed Mar. 28, 2006, Wong Xuan.

(Continued)

*Primary Examiner*—Quoc D Hoang
(74) *Attorney, Agent, or Firm*—Koppel, Patrick, Heybl & Dawson

(57) ABSTRACT

Some embodiments provide surface mount devices that include a first electrode comprising a chip carrier part, a second electrode disposed proximate to the chip carrier part, and a casing encasing a portion of the first and second electrodes. The first electrode can extend from the chip carrier part toward a perimeter of the casing, and the second electrode can extend away from the chip carrier part and projects outside of the casing. In extending away from the chip carrier part the first electrode divides into a plurality of leads separated by an aperture that join into a single first joined lead portion with a first width before projecting outside of the casing and maintains the first width outside of the casing. The second electrode can attain a second width prior to projecting outside of the casing and maintains the second width outside the casing.

18 Claims, 8 Drawing Sheets

U.S. PATENT DOCUMENTS

| | | |
|---|---|---|
| 6,183,100 B1 | 2/2001 | Suckow et al. ............. 362/35 |
| 6,259,608 B1 | 7/2001 | Berardinelli et al. ........ 361/777 |
| 6,296,367 B1 | 10/2001 | Parsons et al. ............. 362/183 |
| 6,359,236 B1 | 3/2002 | DiStefano et al. ........... 174/261 |
| 6,376,902 B1 * | 4/2002 | Arndt ......................... 257/678 |
| 6,454,437 B1 | 9/2002 | Kelly .......................... 362/246 |
| 6,469,321 B2 | 10/2002 | Arndt |
| 6,573,580 B2 | 6/2003 | Arndt |
| 6,610,563 B1 | 8/2003 | Waitl et al. |
| 6,614,058 B2 | 9/2003 | Lin et al. |
| 6,624,491 B2 | 9/2003 | Waitl et al. |
| 6,680,490 B2 | 1/2004 | Yasukawa et al. |
| 6,686,609 B1 | 2/2004 | Sung |
| 6,707,069 B2 | 3/2004 | Song et al. .................... 257/79 |
| 6,710,373 B2 | 3/2004 | Wang .......................... 257/79 |
| 6,759,733 B2 | 7/2004 | Arndt |
| 6,770,498 B2 | 8/2004 | Hsu ............................ 438/26 |
| 6,774,401 B2 | 8/2004 | Nakada et al. |
| 6,858,879 B2 | 2/2005 | Waitl |
| 6,872,585 B2 | 3/2005 | Matsumura et al. |
| 6,876,149 B2 | 4/2005 | Miyashita |
| 6,900,511 B2 | 5/2005 | Ruhnau et al. |
| 6,911,678 B2 | 6/2005 | Fujisawa et al. |
| 6,919,586 B2 | 7/2005 | Fujii |
| 6,940,704 B2 | 9/2005 | Stalions |
| 6,946,714 B2 | 9/2005 | Waitl |
| 6,975,011 B2 | 12/2005 | Arndt et al. |
| 6,995,510 B2 | 2/2006 | Murakami et al. .......... 313/512 |
| 7,021,797 B2 | 4/2006 | Minamo et al. ............. 362/355 |
| 7,064,907 B2 | 6/2006 | Kaneko |
| 7,066,626 B2 | 6/2006 | Omata |
| 7,102,213 B2 | 9/2006 | Sorg |
| 7,119,422 B2 | 10/2006 | Chin ........................... 257/666 |
| 7,224,000 B2 | 5/2007 | Aanegola et al. ............. 257/98 |
| 7,285,802 B2 | 10/2007 | Ouderkirk et al. ........... 257/98 |
| D572,210 S | 7/2008 | Lee ............................ D13/180 |
| D572,670 S | 7/2008 | Ono et al. ................... D13/180 |
| D576,574 S | 9/2008 | Kobayakawa .............. D13/180 |
| 2002/0061174 A1 | 5/2002 | Hurt et al. |
| 2002/0123163 A1 | 9/2002 | Fujii |
| 2002/0163001 A1 | 11/2002 | Shaddock |
| 2002/0171911 A1 | 11/2002 | Maegawa |
| 2002/0195935 A1 | 12/2002 | Jager |
| 2003/0183852 A1 | 10/2003 | Takenaka |
| 2004/0041222 A1 | 3/2004 | Loh |
| 2004/0047151 A1 | 3/2004 | Bogner et al. |
| 2004/0079957 A1 | 4/2004 | Andrews et al. |
| 2004/0080939 A1 | 4/2004 | Braddell et al. |
| 2004/0126913 A1 | 7/2004 | Loh |
| 2004/0201028 A1 | 10/2004 | Waitl |
| 2004/0227149 A1 | 11/2004 | Ibbetson |
| 2004/0232435 A1 | 11/2004 | Hofer |
| 2004/0238930 A1 | 12/2004 | Arndt |
| 2005/0023548 A1 | 2/2005 | Bhat |
| 2005/0072981 A1 | 4/2005 | Suenaga |
| 2005/0077535 A1 | 4/2005 | Li |
| 2005/0093005 A1 | 5/2005 | Ruhnau |
| 2005/0117320 A1 | 6/2005 | Leu et al. |
| 2005/0127377 A1 | 6/2005 | Arndt |
| 2005/0152127 A1 | 7/2005 | Kamiya et al. |
| 2005/0179376 A1 | 8/2005 | Fung et al. |
| 2006/0022212 A1 | 2/2006 | Waitl |
| 2006/0049477 A1 | 3/2006 | Arndt |
| 2006/0108594 A1 | 5/2006 | Iwasaki et al. |
| 2006/0157828 A1 | 7/2006 | Sorg |
| 2006/0220046 A1 | 10/2006 | Yu et al. |
| 2007/0269586 A1 | 11/2007 | Leatherdale |
| 2008/0074032 A1 | 3/2008 | Yano et al. |

FOREIGN PATENT DOCUMENTS

| | | |
|---|---|---|
| CN | 1591924 A | 3/2005 |
| CN | 1679168 A | 10/2005 |
| CN | 1744335 A | 3/2006 |
| DE | WO9931737 | 6/1999 |
| DE | WO2004027882 | 4/2004 |
| EP | 1005085 A2 | 5/2000 |
| EP | 1187226 | 3/2002 |
| EP | 1187227 | 3/2002 |
| EP | 1187228 | 3/2002 |
| EP | 1521313 | 4/2005 |
| JP | 8139257 | 5/1996 |
| JP | 2000223752 | 8/2000 |
| JP | 2001 060072 A | 3/2001 |
| WO | WO 0217405 | 2/2002 |
| WO | WO 2004044877 | 5/2004 |
| WO | WO 2005104247 | 3/2005 |
| WO | WO 2005043627 A1 | 5/2005 |
| WO | WO 2006054228 A2 | 5/2006 |
| WO | WO 2006054228 A3 | 5/2006 |

OTHER PUBLICATIONS

PCT International Search Report and Written Opinion.
PCT International Preliminary Report, PCT/IB2007/002411, Date: Sep. 4, 2008.
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.

* cited by examiner

APPARATUS AND METHOD FOR USE IN MOUNTING ELECTRONIC ELEMENTS

FIELD OF THE INVENTION

The present invention relates generally to mounting electronic devices, and more particularly to surface mount devices.

BACKGROUND

Over the last several decades there has been a dramatic increase in the number and types of devices that are implemented utilizing circuit boards. The frequency with which devices and/or chips are mounted onto circuit boards has similarly grown. Improving the mounting of devices improves the final product incorporating the mounted devices and can significantly reduce the cost and complexity of the product.

The mounting of devices can be achieved through soldering, bonding and other similar methods. Further, devices can be mounted in many different configurations and/or orientations. Some devices are configured to allow one or more orientations for mounting. It can be difficult to mount some of these devices, and further the mounting of some of these devices may deteriorate over time. As a result, the accuracy of the operation of the product incorporating these mounted devices can degrade and/or fail to operate.

SUMMARY OF THE EMBODIMENT

The present embodiments advantageously addresses the needs above as well as other needs by providing systems, devices, methods of manufacturing and methods of mounting devices, such as mounting devices onto a circuit board. Some embodiments provide surface mount devices that include a first electrode comprising a chip carrier part, a second electrode disposed proximate to the chip carrier part and separated from the chip carrier part by an insulation gap, and a casing encasing a portion of the first electrode and a portion of the second electrode, where the casing comprises a recess extending from a first surface of the casing into the casing such that at least a portion of the chip carrier part is exposed through the recess. The first electrode can extend from the chip carrier part toward a perimeter of the casing and project outside of the casing, and the second electrode can extend away from the chip carrier part and project outside of the casing. Further, the first electrode extends from the chip carrier part toward a perimeter of the casing, divides into a first plurality of leads separated by an aperture as the first electrode extends from the chip carrier part toward the perimeter of the casing, the first plurality of leads join into a single first joined lead portion having a first width before the first electrode projects outside of the casing and the first electrode projects outside the casing as the first electrode maintains the first width outside of the casing, and the second electrode extends away from the chip carrier part, attains a second width prior to projecting outside of the casing, and projects outside of the casing maintaining the second width outside of the casing.

Some embodiments provide surface mount devices that comprises a first electrode comprising a chip carrier part and a plurality of leads extending away from the chip carrier part with first and second leads extending generally in parallel and in a first direction away from the chip carrier part and a third lead extending away from the chip carrier part in a second direction substantially opposite the first direction; a second electrode positioned proximate the chip carrier part and extending away from the chip carrier part; an insulation gap separating the second electrode from the first electrode; and a casing that encases portions of the first and second electrodes and where the plurality of leads of the first electrode and the second electrode protrude through surfaces of the casing, and the casing comprising a recess formed in the casing such that a portion of the chip carrier part is exposed through the recess.

Other embodiments provide surface mount devices that comprises a first electrode comprising a chip carrier part; a second electrode disposed at a distance from the chip carrier part; and a casing encasing a portion of the first electrode and a portion of the second electrode, and the casing having a recess extending from a surface of the casing into the casing such that at least a portion of the chip carrier part is exposed through the recess; the first electrode extends from the chip carrier part toward a perimeter of the casing and projects outside of the casing, and wherein the second electrode projects outside of the casing; the first electrode is generally trapezoidal-shaped at the chip carrier part, the first electrode comprises a plurality of leads as the first electrode extends from the chip carrier part toward the perimeter of the casing, the plurality of leads having predefined widths before the plurality of leads project outside of the casing and maintaining the predefined widths outside of the casing, and the second lead attaining an additional predefined width prior to projecting outside the casing and maintaining the additional predefined width outside of the casing.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

The above and other aspects, features and advantages of the present embodiments will be more apparent from the following more particular description thereof, presented in conjunction with the following drawings wherein.

Figure 1:
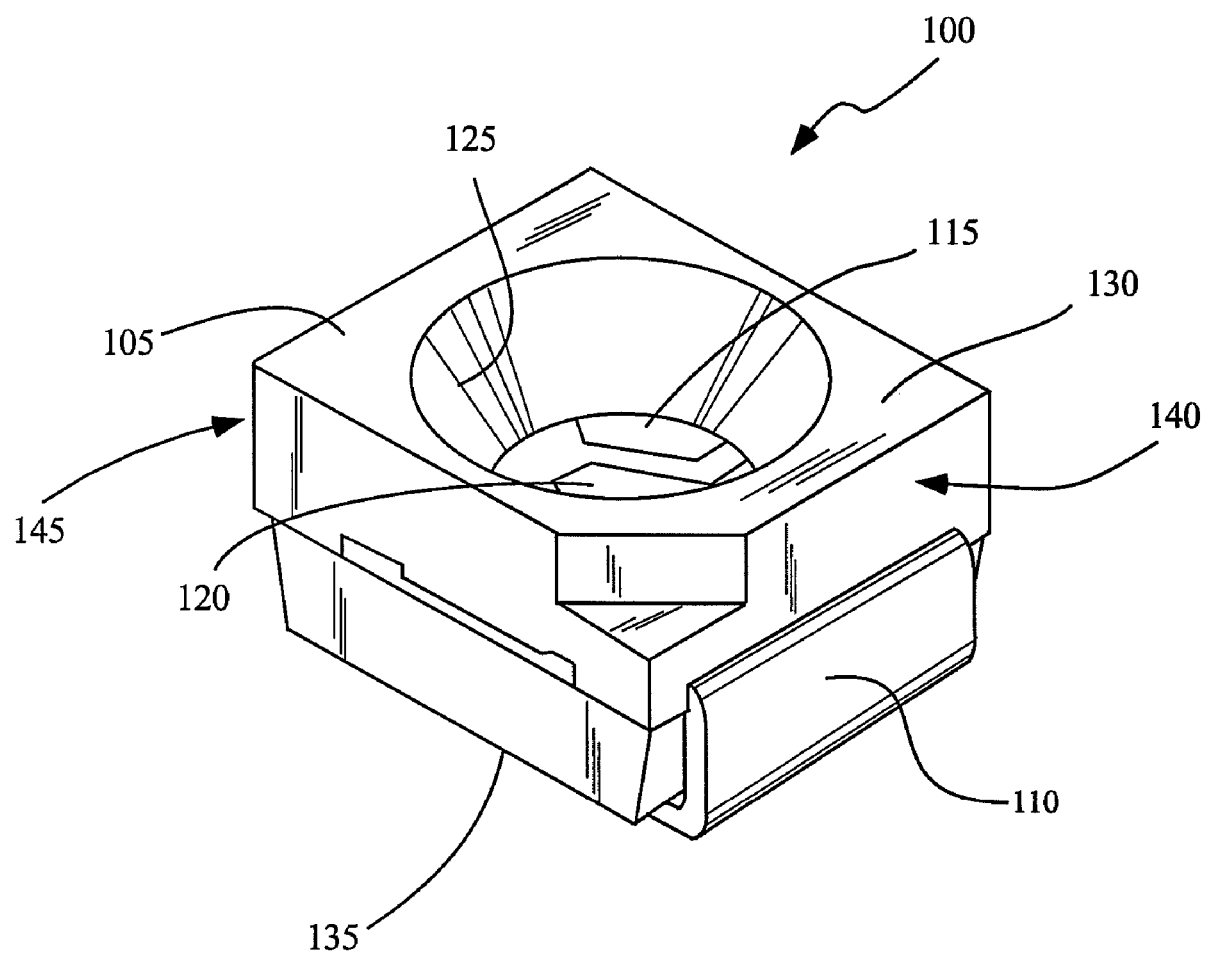
FIG. 1 depicts a perspective view of a surface mount device according to some embodiments.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

The present embodiments provide apparatuses, systems, methods of manufacturing and methods for mounting electronic devices or elements, such as mounting an electronic element onto a circuit board. For example, some embodiments are particularly applicable to surface mount devices used to mount electronic elements, such as optoelectronic devices or elements that receive, emit, scatter and/or deflect light, and other such electronic elements. The optoelectronic elements can include, for example, one or more of a light emitting diode (LED), a solar cell, a photodiode, a laser diode, and other such optoelectronic elements or combinations of optoelectronic elements. Some embodiments of the surface mount devices are designed, at least in part, to stabilize the electronic element and/or to dissipate heat from the electronic element.

FIG. 1 depicts a perspective view of a surface mount device 100 according to some embodiments that can be used to mount, for example, an optoelectronic device or element. The surface mount device 100 comprises a casing 105, a first electrode 110 and a second electrode 115. The casing is typically constructed of a non-conductive material, and/or thermally conductive material. In some embodiments, the casing can be formed from plastic(s), ceramic(s), and substantially any other relevant material and combinations of materials. The first and second electrodes 110, 115 are partially encased by the casing 105 and extend through and outside of the casing 105. In some embodiments, after the first and second electrode 110, 115 are outside of the casing 105, the first and second electrode 110, 115 are bent generally orthogonally to the encased portions of the first and second electrodes 110, 115 and are again bent generally orthogonally to extend along a first surface 135 of the casing 105. The first electrode 110 includes a chip carrier part 120 where one or more optoelectronic elements or other electronic elements can be electrically coupled to the first electrode 110.

In some embodiments, a recess 125 is formed or defined in the casing 105 extending from a second surface 130 of the casing 105 into the casing 105 to the first and second electrodes 110, 115. The recess 125 can extend into the casing 105 exposing a portion of the first electrode 110 and/or the second electrode 115.

Figure 2:
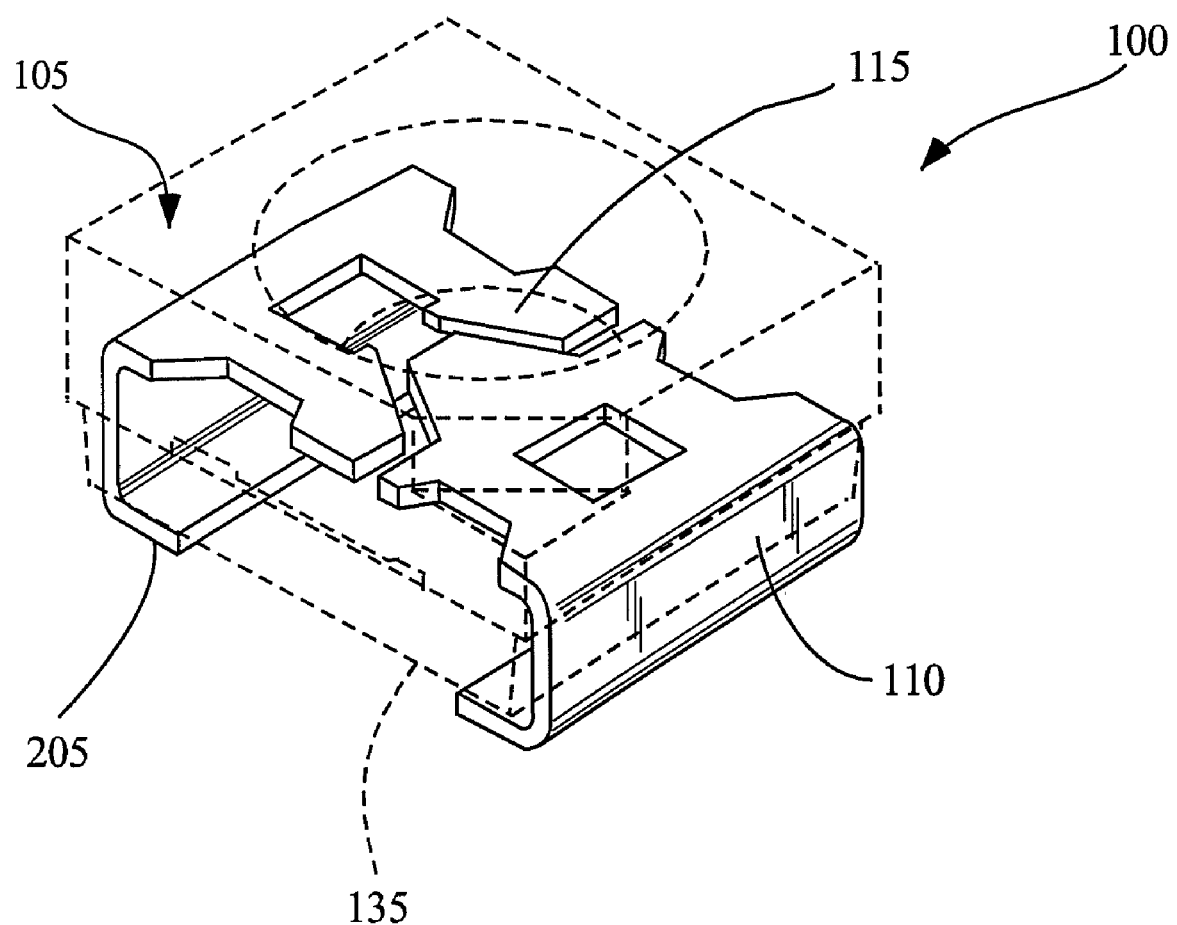
FIG. 2 depicts a partially transparent perspective view of the surface mount device of FIG. 1, illustrating electrodes within a casing.

FIG. 2 depicts a partially transparent perspective view of the surface mount device 100 of FIG. 1 further illustrating portions of the first and second electrode 110, 115 encased within the casing 105. In some embodiments, the first electrode 110 extends away from the chip carrier part or area 120 and passes through a third surface 140 of the casing 105. The second lead 115 can similarly extend away from the chip carrier part toward a perimeter of the casing and through a fourth surface 145 of the casing 105.

Figure 3:
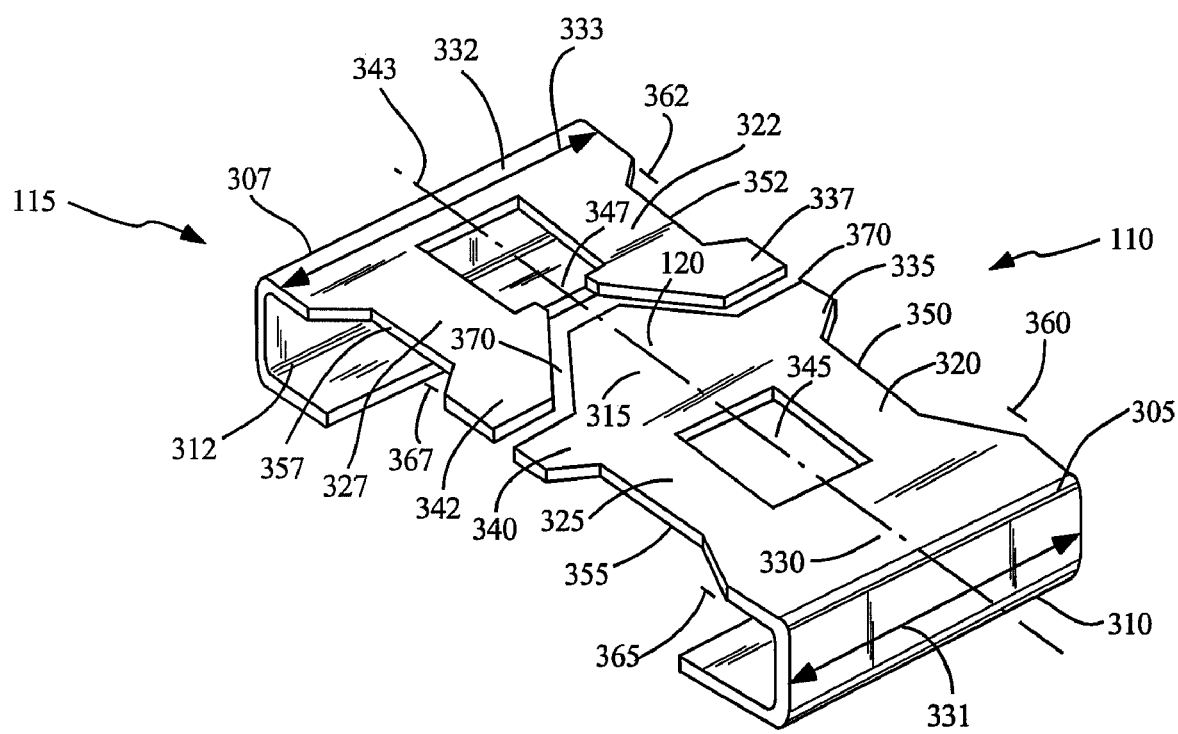
FIG. 3 depicts an enlarged perspective view of the electrodes illustrated in FIG. 2 without the casing.

FIG. 3 depicts an enlarged perspective view of the first and second electrode 110, 115 without the casing 105 where the first and second electrodes are separated by an insulation gap 370. In some embodiments, the first electrode 110 includes the chip carrier part 120 that can further include protrusions or extensions portions 335, 340, first and second lead portions 320, 325 separated by an aperture 345, and a joined lead portion 330 that, in some implementations, is further bent at the first bend 305 and the second bend 310. The second electrode 115 can include first and second lead portions 322, 327 and joined lead portion 332 that, again in some implementations, is bent at the first and second bends 307, 312. The first and second lead portions 322, 327 can include head ends 337 and 342, respectively, that are positioned juxtaposed to the chip carrier part 120. The second electrode 115 can further include first and second extended portions 322, 327 extending from the first and second head ends 337, 342, respectively.

Referring to FIGS. 1-3, the first electrode 110 extends from the chip carrier part 120 toward a perimeter of the casing 105. The first electrode 110 can be bent generally orthogonally at the first bend 305 at the third surface 140 and further bent generally orthogonally at the second bend 310, enabling the first electrode 110 to extend along a portion of the first surface 135 of the casing 105 establishing one or more external electrical connections. The first and second electrodes 110 and 115 can be arranged in other configurations depending on an anticipated use and/or implementation. For example, the first and second leads can pass through the third and fourth surfaces 140, 145, respectively, and continue to extend away from the casing 105 while gradually slanting or being bent toward a plane defined by the first surface 135 of the casing, or other relevant configurations.

In some embodiments, the chip carrier part 120 is generally triangular-shaped. The size and shape of the chip carrier part 120 may be dependent upon the size and/or type of electronic element to be placed thereon, based on the desired dissipation of heat across the chip carrier part 120 and/or across the first electrode 110, and/or other such factors. The chip carrier part can be implemented through other configurations and/or shapes. By way of example, the chip carrier part 120 could be shaped in a variety of fashions such as trapezoidal, square, rectangular, circular or other such shapes.

According to some implementations, the first electrode 110 includes the aperture 345 defined between the first and second lead portions 320, 325. As such, the first and second lead portions 320, 325 extend from the chip carrier part 120 and are separated by and/or form the aperture 345. Further, the first and second lead portions join to form the joined lead portion 330 forming a single lead portion prior to the first electrode 110 extending or projecting through the third surface 140 and outside of the casing 105. The chip carrier part 120 can be formed of a single lead portion 315 that widens as it extends toward the perimeter of the casing 105 and the led portions. In some embodiments, the chip carrier part widens to form the extension portions 335, 340. In some implementations, the chip carrier part 120 is configured to taper away from a central axis 343 from an end of the chip carrier part farthest from the third surface 140 of the casing 105 and then extend away from the central axis at the extension portions 335, 340, which in some embodiments depending on intended implementation and/or electronic device to be utilized, can be more than about 0.4 mm from the end of the chip carrier part farthest from the third surface 140, and typically more than about 0.5 mm, for example, about 0.65 mm.

The first and second extension portions 335, 340 taper toward the central axis 343 of the first electrode 110 such that the first electrode 110 narrows as it splits into the two lead portions 320, 325. The aperture 345 is formed in the first electrode 110 separating the first and second lead portions 320, 325. Further, the aperture 345 defines a boundary of the chip carrier part 120. In some implementations, depending on intended implementation and/or the type of electronic device to be mounted with the chip carrier part, aperture 345 can be more than about 0.6 mm from the end of the chip carrier part farthest from the third surface 140 of the casing 105, typically more than about 0.8 mm, for example, about 0.1 mm. The aperture 345 may, for example, be generally square, rectangular, trapezoidal, other polygonal shape, circular, oval or substantially any other relevant other shape. Further, the width of the aperture 345, in some embodiments depending on intended implementation and/or electronic device to be utilized, can be more than about 0.4 mm, and typically more than about 0.5 mm, for example, about 0.7 mm. Before the first electrode 110 projects through the third surface 140 and outside of the casing 105, the first and second lead portions 320, 325 join forming the joined lead portion 330. In some implementations, the first and second lead portions 320, 325 further widen, tapering away from the central axis 343 and join into the single joined lead portion 330 having a width 331. The first electrode 110 maintains the width 331 as a constant width outside of the casing 105 as the lead is bent around the casing 105.

The tapering toward the central axis 343 from the extension portions 335 and 340 and the tapering of the lead portions 320, 325 away from the central axis can form first and second indentations 360, 365 along first and second sides or edges 350, 355 of the first electrode 110, respectively. In some embodiments, the first and/or second indentations 360, 365 defined along the first and/or second edges 350, 355 may be generally trapezoidal and formed in the lead portions 320, 325. The first and second indentation 360, 365 can be formed in other relevant shapes, such as, square, rectangular or other relevant shapes.

Still referring to FIGS. 1-3, the second electrode 115 generally extends from proximate the chip carrier part 120 away from or in an opposite direction than the first electrode 110 toward a perimeter of the casing 105. The second electrode 115 is bent generally orthogonally at the first bend 307 and again bent generally orthogonally at the second bend 312 such that the second electrode 115 wraps around the casing 105 to extend along the first surface 135 of the casing 105 to establish one or more potential external electrical connections. In some embodiments, the second electrode 115 may be bent and/or arranged relative to the surface mount device 100 in other configurations for establishing external electrical connections, such as those described above with respect to alternate configurations of the first electrode 110, or other relevant configurations.

The second electrode 115 comprises a plurality of lead portions 322, 327 that extend away from the chip carrier part 320 toward the fourth surface 145 of the casing 105. Prior to exiting the casing at the fourth surface 145, the first and second lead portions 322, 327 join into a single joined lead portion 332. The joined lead portion 332 has a width 333 prior to exiting the casing 105. In some embodiments, the width 333 is maintained as a constant width as the second electrode 115 projects through the fourth surface 145 and outside of the casing 105.

The first and second lead portions 322 and 327 of the second electrode 115 include the first and second head ends 337 and 342, respectively. The head ends 337, 342 are positioned proximate and/or adjacent the chip carrier part 320 and separated from the first electrode 110 by the insulation gap 370. Typically, the insulation gap 370 electrically insulates and/or separates the first and second electrodes 110, 115. In some implementations, the insulation gap 370 has a width of between about 0.1 and 0.3 mm, for example about 0.2 mm+/− 0.05 mm.

In some embodiments, the first and second head ends 337, 342 are shaped such that edges of the head ends parallel or mimic edges of the chip carrier part 320. By way of example, the first and second head ends 337, 342 of the second electrode 115 may be generally trapezoidal-shaped such that the head ends parallel the extension portions 335, 340 and the generally triangular shape of the chip carrier part 320. In some implementations, a portion of the chip carrier part extends between the head ends 337, 342 as the head ends taper away from the first electrode and toward the central axis 343. The first and second head ends further narrow as the lead portions 322, 327 extend away from the chip carrier part 120 toward the fourth surface 145 of the casing 105. The lead portions 322, 327 maintain a width greater than 0.35 mm, typically greater than 0.4 mm, for example, greater than about 0.41 mm as they extend from the head ends 337, 342. A spacer, inlet, void area, aperture or other separation 347 is defined or formed in the second electrode 115 separating the head ends 337, and 342, and first and second extended leads portions 322, 327 of the second electrode 115. The inlet 347 may, for example, be generally square, rectangular, trapezoidal, other polygonal shape, circular, oval or other relevant shapes. The inlet 347 can have similar dimensions as the aperture 345, in some embodiments depending on intended implementation and/or electronic device to be utilized, with a width for example that is more than about 0.4 mm, and typically more than about 0.5 mm, such as about 0.7 mm. At a termination of the inlet 347 the first and second lead portions 322, 327 of the second electrode 115 merge or join together prior to the second lead extending or projecting through the fourth surface 145 and outside of the casing 105 forming the joined lead portion 332.

In some embodiments, the first and second lead portions 322, 327 of the second electrode 115 narrow defining the first and second head ends 337 and 342. An interior narrowing widens the inlet 347, and an exterior narrowing in some implementations tapers toward the central axis 343. The first and second lead portions 322, 327 further widen (e.g., tapering) away from the central axis 343 of the second electrode 115 and join into the joined lead portion where the joined lead portion 332 defines a termination of the inlet 347. Again, the joined lead portion 332 can be configured with a width 333 prior to exiting the fourth surface 145 of the casing, and in some instances maintains that width 332 as a constant width as the second electrode extends along the third surface 145 and the first surface 135 of the casing 105.

The tapering in toward the central axis 343 and tapering out away from the central axis 343 along a first edge 352 of the second electrode 115 defines a first indentation 362, and in some instances may have a generally trapezoidal shape. Similarly, a second indentation 367 is formed along a second edge 357 of the second electrode 115 that, in some implementations, has a generally trapezoidal shape. The first and second indentation 362, 367 of the second electrode 115 can be formed in other relevant shapes, such as square, rectangular or other shapes.

The insulation gap 370 is defined between the first electrode 110 and the second electrode 115. Typically, the first electrode 110 is electrically isolated and/or separated from the second electrode 115 by the insulation gap. The insulation gap 370 separates the chip carrier part 320 from the head ends 337, 342 of the first and second lead portions 322, 327. The width of the gap 370 can be substantially any width, and typically is dependent on the electrical device or element to be coupled with the chip carrier part 320, the voltage, current and/or power level of operation of the surface mount device 100, the intended implementation of the surface mount device 100, the material of the first and second electrodes, and other relevant factors or combinations of factors.

Figure 4:
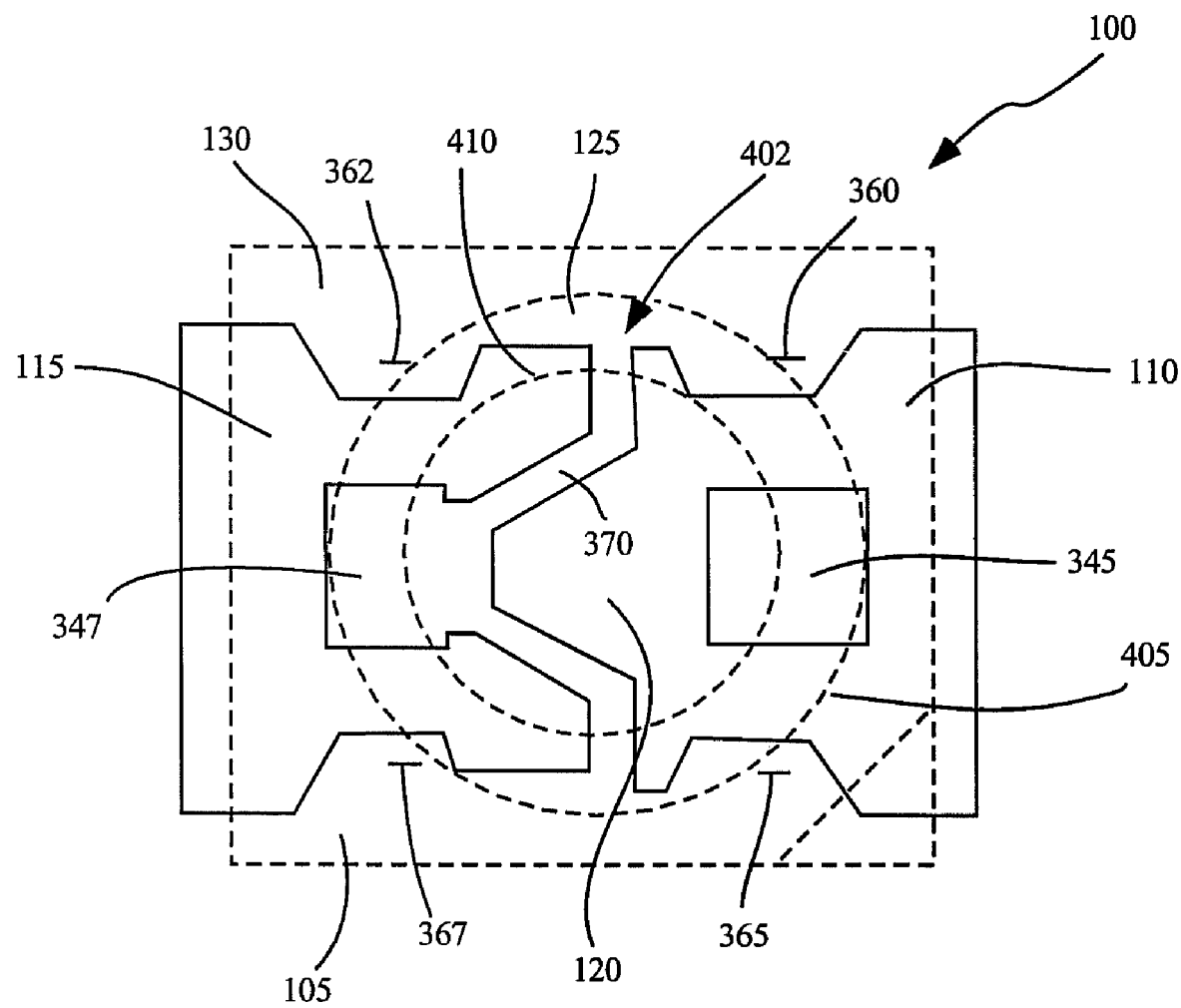
FIG. 4 depicts a partially transparent overhead view of the of the surface mount device of FIG. 1.

FIG. 4 depicts a partially transparent overhead view of the surface mount device 100, transparently illustrating the casing 105 so that the first and second electrodes 110, 115 are visible through the casing 105, according to some embodiments. The recess 125 in some implementations is generally conical in shape and includes a wall 402 that tapers from an outer perimeter of the recess at the second surface 130 of the casing 105 to an interior perimeter of the recess 410 at about the first and second electrodes 110, 115. As such, at least a portion of the first and second electrodes 110, 115 are exposed through the recess 125. Further, portions of the casing surrounding the exposed portions of the electrodes and within the interior perimeter 410 of the recess 125 are also exposed through the recess 126. The embodiment of FIG. 4 depicts portions of the first and second electrode 110, 115, portions of the insulation gap 370, a first portion of the aperture 345, and a first portion of the inlet 347 extending into and being exposed through the recess 125.

The insulation gap 370, the aperture 345, the inlet 347 and the indentation 360, 365, 362, 367, in addition to apertures in some other embodiments, are void or vacant of lead material. The recess 125 and/or the first and/or second electrodes 110, 115 may be variously designed or configured to expose different regions of the electrodes and/or casing. In some embodiments, a fill material is incorporated into the recess 125 that fills at least some of the recess 125 in the casing 105, and typically covers those portions of the first and second electrodes 110, 115 extending into the interior perimeter 410 of and exposed through the recess. The fill material may also, at least partially, cover and/or fill those portions of the insulation gap 370, the first portion of the aperture 345, and first portion of the inlet 347 that also extended into the interior perimeter 410 and are exposed through the recess 125.

An electronic element (e.g., optoelectronic element) is typically coupled with and/or supported by the first electrode 110 at the chip carrier part 120. The electronic element is further coupled with the second electrode 115 through a connection (e.g., a bond wire or other such connection). Further, the electronic element typically is at least partially exposed through the recess 125. Some implementations include the fill material that fills at least some of the recess 125 in the casing 105, and typically surrounds and/or covers the electronic element, the exposed portions of the first and second electrodes 110, 115, and the electrical connection(s) between the electronic element and the electrodes. The fill material may also, at least partially, cover and/or fill portions of the insulation gap 370, the aperture 345, and inlet 347 that extend into and are exposed through the recess 125.

The first and second electrodes 110, 115 are typically made from electrically conductive material. In some embodiments, the electrode material is also thermally conductive to assist, at least in part, in drawing heat away from the electronic and/or optoelectronic element. The chip carrier part 120 of the first electrode 110 may be configured, in part, to support and electrically couple with the optoelectronic element. The optoelectronic element is coupled to the chip carrier part or area 120 in one of many ways, such as with an adhesive, coating, film, encapsulant, solder, paste, grease and/or other such methods. These coupling mechanisms may be thermally as well as electrically conductive.

Similarly, the optoelectronic element is coupled to the second electrode 115 through one or more similar methods. For example, in some embodiments the optoelectronic element is electrically coupled to the second electrode 115 through a wire connection. Additionally or alternatively, the optoelectronic element may be partially supported by, and coupled to the first electrode 110, and extend over the insulation gap 370 to couple with the first and/or second head end 337, 342 of the second electrode 115.

In some embodiments, the first electrode 110 is coupled to a cathode portion of the optoelectronic element and is defined as the cathode lead of the surface mount device 100. Further, the second electrode 115 is coupled to an anode portion of the optoelectronic element and is defined as the anode of the surface mount device 100. Thus, the insulation gap 370 between the first electrode 110 and the second electrode 115 provides, for example, an electrical separation and/or insulation between the anode and cathode of the surface mount device 100.

The casing 105 of the surface mount device 100 encases a portion of the first and second electrodes 110, 115. In some embodiments, the casing 105 is generally cubical in shape. However, the casing 105 may have substantially any relevant shape, including having multiple portions where a first portion includes a pair of supports or legs. The casing 105 can further include markings indicating the type of device, orientation and/or pin numbering.

In some methods of manufacturing, the optoelectronic element is coupled to the first and second electrodes 110, 115 prior to constructing the casing 105. Alternatively, the optoelectronic element may be coupled to the electrodes after the first and second electrode 110, 115 are partially encased within the casing 105. Thus, in some embodiments, the casing 105 may be configured with the recess 125 that extends into the casing exposing a sufficient area of at least the chip carrier part 120 to receive, mount and secure the optoelectronic element within the recess 125.

The recess 125 is, in part, shaped to expose at least a portion of the optoelectronic element, such that when coupled to electrodes the optoelectronic element in some implementations may emit and/or receive light. The recess 125 is, for example, shaped, formed, cut, molded, or constructed into substantially any shape relevant to the application of the surface mount device 100. In some embodiments, the recess 125 is generally a conical shape. Alternatively, other shapes, or portions of shapes, can be implemented for the recess 125, such as generally cylindrical, cubical, semi-spherical, octagonal, pyramidal, parabolic, and other relevant shapes. The recess 125 may, at least in part, facilitate the distribution and/or absorption of the light emitted/received from/by the optoelectronic element. In some embodiments, the shape of the recess 125 works in conjunction with the fill material deposited in the recess 125.

The fill material is implemented, in some embodiments, to provide at least some protection of the exposed optoelectronic element. Additionally, the fill material can, in part, enhance the distribution/absorption of light for the optoelectronic element. The fill material can be formed from one or more of a resin, an epoxy, a thermoplastic polycondensate (e.g. a polyphthalamide (PPA)), a plastic, glass, nylon and/or other such relevant materials and/or combinations of materials. In some embodiments, additional materials are added to the fill material to enhance the emission, absorption and/or dispersion of light to and/or from the optoelectronic element.

Still referring to FIGS. 1-4, the first and second electrodes 110, 115 are partially encased by the casing. In some embodiments, the thickness of the first electrode 110 and/or second electrode 115 is substantially even in thickness and flat along a least a portion of the lengths of the electrodes encased in the casing. The encased portions of the first and second electrodes 110, 115 generally lay along the same plane. For simplicity, portions of the casing 105 along a plane defined by surfaces of the first and second electrodes 110, 115 that are opposite or face away from the recess are referred to below as being "beneath" the lead element, and the portion of the casing 105 "above" the plane created by the first and second electrodes 110, 115 are referred to as being "above" the lead element. In some implementations, the casing material, fill material and/or other material (e.g., epoxy, resin, adhesive, and other such relevant material) extend partially into and/or through one or more of the vacant areas including, but not limited to, the aperture 345, inlet 347, insulation gap 370, through holes, indentations 360, 365, 362, 367, beveled corners and/or other recesses or areas vacant of electrode material. For example, those vacant areas encased by the casing can be at least partially filled with casing material, one or more pegs from the casing extending through the vacant areas and other such configurations.

The aperture 345, inlet 347 and the insulation gap 370 (referred to generally as vacant areas) are partially encased by the casing 105 and further extend into the interior perimeter 410 and exposed through the recess 125. For example, an encased portion of the vacant areas expose the casing beneath the vacant areas to the casing material above the vacant areas, and casing material or other connections or material extend through at least portions of the vacant areas. Further, the portions of the casing 105 below an exposed or un-encased portions of the vacant areas are exposed through the recess 125, and in some implementations, the un-encased portions of the vacant areas are further covered or filled with fill material. The configuration of the first and second electrodes 110, 115, with the aperture 345, inlet 347 and insulation gap 370, in part, increases surface bonding areas around the electrodes including the casing beneath the electrodes exposed by the vacant areas to bond with the fill material and/or casing material above the electrodes and/or extending through the vacant areas.

The enhanced bonding provided through and around the first and second electrodes 110, 115, at least in part, enhances the stability of the first and second electrode 110, 115 relative to the casing 105 and the structural integrity of the surface mount device 100. The structural integrity is further maintained, at least in part, through the electrodes 110, 115 adhering to the casing 105, the fill material, and/or the optoelectronic element. In some embodiments, however, the bonding or adhesion between casing material, and/or between casing material and fill material is greater than the bonding or adhesion established between the casing and the electrodes, and between the electrodes and the fill material.

Further, during use in some implantations the electrodes can increase in temperature and this increase in temperature can cause deterioration in the adhesion or bonding between the electrodes and the casing, and/or between the electrodes and the fill material. Poor adhesion between components of the surface mount device 100 may lead to a deterioration of the device. For example, poor adhesion between the electrodes 110, 115 and the casing 105 may allow the electrodes 110, 115 to shift inside the surface mount device 100. A shifting of the electrodes 110, 115 may lead to an incorrect positioning of the optoelectronic element, a deterioration of the device 100, and/or may eventually lead to failure. Some embodiments increase the areas of adhesion between the casing above and below the electrodes and between the fill material and the casing 105 further contributing to maintaining the configuration and structural integrity of the surface mount device 100.

The aperture 345, inlet 347, insulation gap 370, and/or indentations 360, 362, 365, 367 increase the adhesion areas around the electrodes 110, 115, and in part facilitate the securing of the positioning of the first and second electrodes 110, 115 and the optoelectronic element relative to the casing 105 and/or recess 125. Further, by incorporating casing material and/or fill material into the aperture 345, inlet 347 and insulation gap 370, the relative positioning of the chip carrier part 120 and/or optoelectronic element are more precisely maintained. Still further, the relative angles of tapering, the shape of the aperture 345, inlet 347 and indentations 360, 362, 365, 367, extension portions 335, 342, and/or head ends 337, 342 allow casing and/or fill material to be positioned around the electrodes to enhance the stability of positioning of the electrodes relative to the casing and/or recess 125. The increased stability of the optoelectronic element further improves performance of the surface mount device 100 and increases reliability of the surface mount device 100. In some embodiments, the adhesion capacity between the components of the surface mount device 100 is further enhanced by increasing the surface area of the casing exposed through the recess 125. For example, the diameter of the recess 125 at the surface of the chip carrier part 120 could be increased to expose the casing 105 outside of the chip carrier part 120. However, the casing real estate available for the recess 125 is limited, and a change in the recess 125 may affect the emission/absorption of the light from/by the optoelectronic element.

Furthermore, in some implementations mounting devices 100 may be subjected to environments with relatively high heat and/or vibration. Accordingly, the shape of the first and/or second electrode 110, 115 and/or the recess 125 are designed in some embodiments to, at least in part, increase the adhesion areas around and/or through the electrodes 110, 115 of the surface mount device 100. Further, at least the aperture 345, inlet 347 and insulation gap 370 (vacant areas) further maintain positioning of the chip carrier part 120 relative to the casing 105 and thus increase stability of the electronic element and/or optoelectronic element. An increase in adhesion areas of the casing at least in part increases the stability of the components and secures positioning such that the devices can be accurately and reliably utilized in adverse conditions including relatively high heat and/or subject to relatively large amounts of vibration.

Additional vacant areas may be included in the electrodes according to some embodiments to, at least in part, further increase the adhesion areas through and/or around the electrodes 110, 115 maintain the positioning of the electrodes 110, 115 within the casing. Additional vacant areas through holes or bores and can extend through the first or second electrodes 110, 115. These through holes can be circular, square, rectangular, triangular, irregular, or other relevant shapes or combination of shapes. Vacant areas may be formed or fashioned through many different methods, such as molded, bored, drilled, etched, punched out, cut, filed, or other such methods and/or combinations of methods.

As described above, the first and second electrodes 110, 115 may have a poor adhesion capacity with the casing material and/or fill material. Direct coupling of the casing material through the vacant areas to the casing 105 above and beneath the vacant areas of the electrodes 110, 115 at least in part further secures the positioning of the electrodes 110, 115 within the surface mount device 100. Additionally or alternatively, an adhesive material can be utilized to at least partially fill the aperture 345, inlet 347 and insulation gap 370, or additional vacant areas, to adhere the casing 105 and/or fill material above the first and second electrodes 110, 115 to the casing 105 beneath the electrodes. The adhesive material could be substantially any relevant material that adheres to the casing and/or fill material, such as glue, epoxy, resin, and other types of relevant adhesive material.

The casing 105 can be formed and/or assembled through one or more methods. In some embodiments, the casing 105 is formed or molded around the electrodes 110, 115. Additionally or alternatively the casing can be molded into sections, for example, a top and a bottom. Each section may incorporate molding that facilitates, in part, securing the electrodes with the sections of the casings. The top and bottom portions are secured together, sandwiching portions of the first and second electrodes 110, 115. The top and bottom sections are secured together, for example, with adhesive material, peg and slots, snap fit, spring biasing, lever arms, friction fit, and or other relevant methods. In other embodiments, a base section may be pre-molded allocating space for the electrodes 110, 115 to be secured onto the base of the casing 105, and a top section of the casing 105 is formed, molded or poured over the electrodes 110, 115.

For example, the top portion of the casing can be formed by pouring casing material over the top of a portion of the electrodes that are coupled to a base section. In this example, the vacant areas not exposed by the recess 125 are covered by and/or at least partially filled in with, casing material. Portions of the insulation gap 370 and beveled corners not exposed through the recess 125 may also be at least partially filled by the casing material. In other embodiments, the bottom of the casing 105 is molded such that casing material beneath the electrodes extends through the vacant areas (e.g., aperture 345, inlet 347, insulation gap 370, and/or beveled corners) to mate or cooperate with a top portion of the casing 105 above the electrodes. In some implementations, the bottom portion can include pegs that extend through the vacant areas to couple with slots in the casing opposite the peg. In other embodiments, the vacant areas contain adhesive material that secures sections of the casing 105 together about the first and second electrodes 110, 115. Further, the indentations 360, 365, 362, 367 provide for additional bonding of the casing material above and below the electrodes 110, 115.

In some embodiments of manufacturing, the fill material is a liquid or semi-liquid and is poured into the recess 125 of the casing 105. The fill material adheres to the casing 105 beneath the first and second electrode 110, 115 through the exposed portion of the vacant areas. Exposed portions of the vacant areas are covered by and/or at least partially filled with fill material. The fill material adheres to the casing 105 beneath the electrodes 110, 115 exposed by vacant areas within the interior perimeter 410 of the recess 125.

Figure 5:
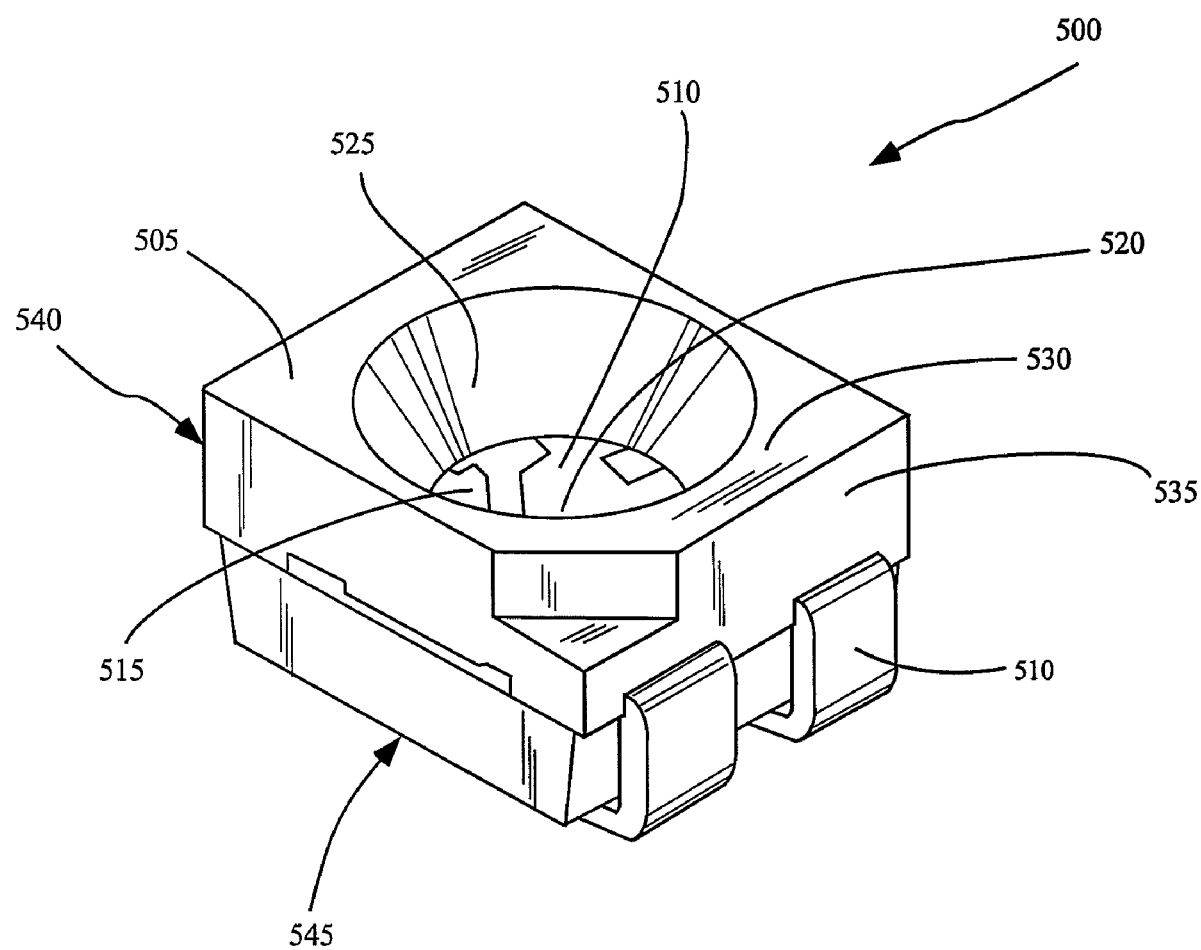
FIG. 5 depicts a perspective view of a surface mount device according to some embodiments.

FIG. 5 depicts a perspective view of a surface mount device 500 according to some embodiments that can be used to mount, for example, one or more electronic elements. The surface mount device 500 comprises a casing 505, a first electrode 510 and a second electrode 515. The casing includes a recess 525 formed in a first surface 530. The casing, in some embodiments, is similar to the casing as described above with reference to FIGS. 1-4. The first and second electrodes 510, 515 are partially encased by the casing 505 and extend through second and third surfaces 535, 540 of the casing and outside of the casing 505. The first and second electrodes 510, 515 are typically constructed of electrically conductive material, and in some implementations, are further thermally conductive. The first electrode 510 includes a chip carrier part 520 where one or more electronic elements or devices, such as optoelectronic elements can be positioned and coupled with the first electrode 510.

The recess 525 is formed or defined in the casing 505 extending from the first surface 530 of the casing 505 into the casing 505 to the first and second electrodes 510, 515. In some embodiments, the recess 525 extends into the casing 505 to expose a portion of, at least one of, the first electrode 510 and/or the second electrode 515.

Figure 6:
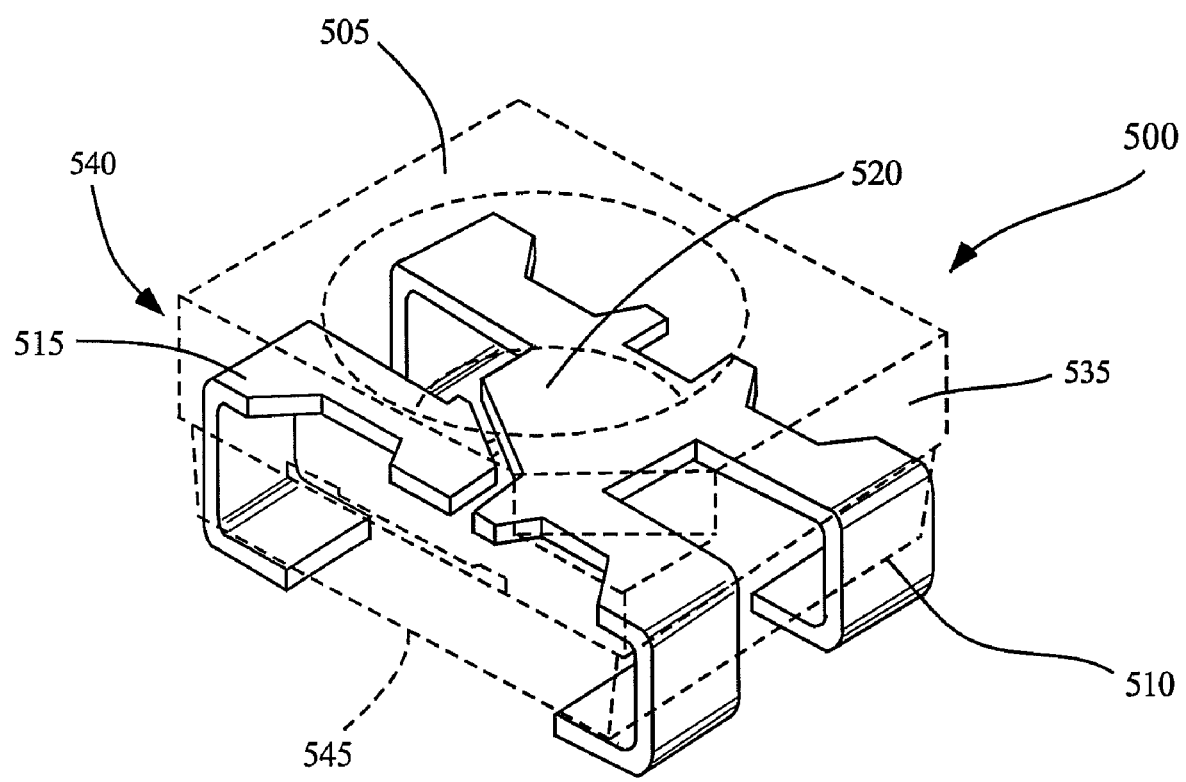
FIG. 6 depicts a partially transparent perspective view of the surface mount device of FIG. 5, illustrating electrodes within a casing.

FIG. 6 depicts a partially transparent perspective view of the surface mount device 500, with the first and second electrode 510, 515 visible within the casing 505. In some embodiments, after the first and second electrode 510, 515 extend through the second and third surfaces 535, 540 and are exterior to the casing 505, the first and second electrodes 510, 515 are bent generally orthogonally to the encased portions of the first and second electrodes 510, 515 to extend generally parallel with the second and third surfaces and again are bent generally orthogonally to extend along a portion of the fourth surface 545 of the casing 505.

Figure 7:
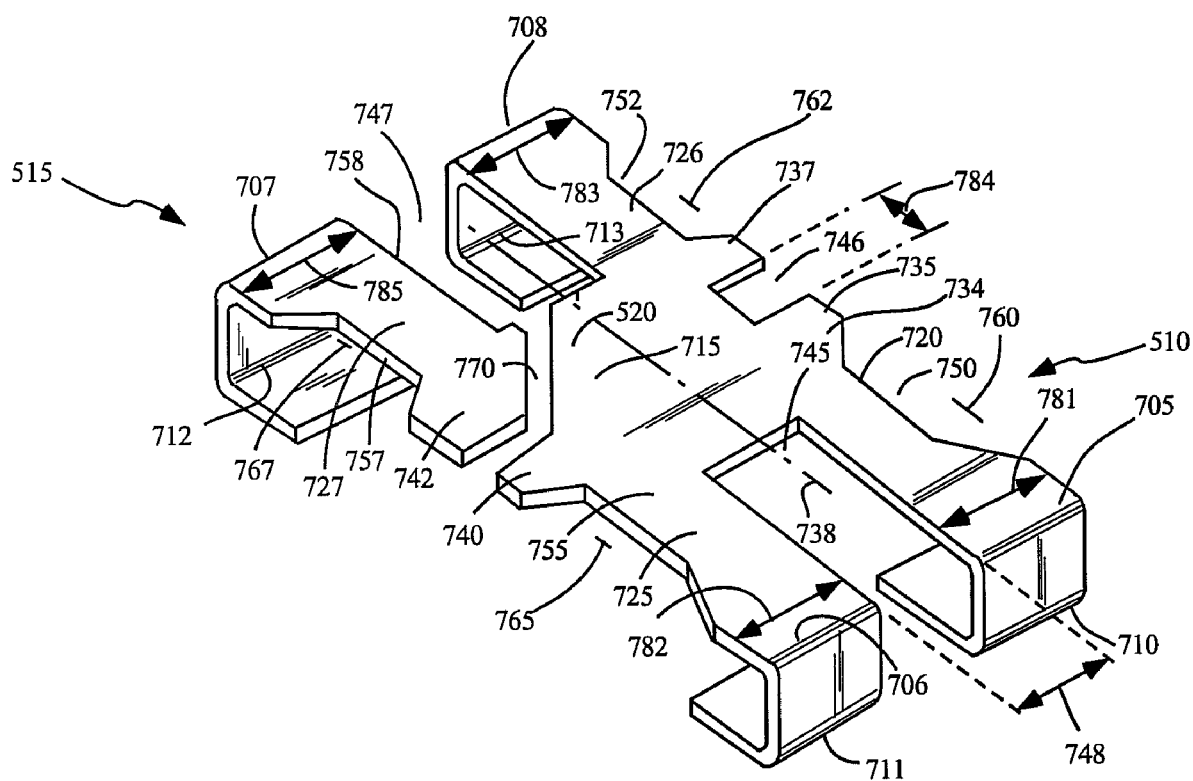
FIG. 7 depicts an enlarged perspective view of the electrodes illustrated in FIG. 6 without the casing.

FIG. 7 depicts an enlarged perspective view of the first and second electrodes 510, 515 separated by an insulation gap 770. The first electrode 510 includes the chip carrier part 520, and first, second and third leads 720, 725 and 726, respectively, extending from the chip carrier part. The second electrode 515 includes a head end 742 and a lead portion 727 extending from the head end. The first electrode 510, in some embodiments, is configured with a plurality of leads 720, 725, 726 to enhance the dissipation of heat from the chip carrier part 520. Still further, the chip carrier part 520 can have an increased area over some other surface mount devices to further aid in dissipating heat from an electronic element cooperated with the first electrode. As such, the surface mount device 500 may be utilized more with higher power electronic devices or element than can be employed in some other surface mount devices.

In some embodiments, the first and second electrodes 510, 515 the first, second and third leads 720, 725 and 726 of the first electrode 510 include bends 705, 706 and 708, respectively, where the leads are bent generally orthogonally and further include bends 710, 711 and 713, respectively, where again the leads are bent generally orthogonally. Similarly, the lead portion 727 of the second electrode 515 can include a first bend 707 such that the second electrode bends generally orthogonally and a second bend 712 that again bends the electrode generally orthogonally. Bending the leads 720, 725, 726 and 727 establishes one or more external electrical connections. In some embodiments, the first and/or second electrodes 510, 515 may be bent and/or arranged relative to the surface mount device 500 in others configurations as are known in the art for establishing an external electrical connection.

Referring to FIGS. 5-7, the chip carrier part 520 in some implementations is generally trapezoidally shaped. The chip carrier part, however, can be configured in substantially any relevant shape. By way of example, the chip carrier part 520 could be shaped in a variety of fashions such as trapezoidal, square, rectangular, circular or other relevant shapes. The size and shape of the chip carrier part 520 may be dependent upon the size and/or type of electronic element to be placed thereon, upon the desired dissipation of heat across the chip carrier part 520 and/or across the first electrode 510, and/or other such factors.

The first electrode 510 can be configured as a single contiguous piece 715 forming the chip carrier part 520 and splitting into the first, second and third leads 720, 725, 726 as the first electrode 510 expands or extends away from the chip carrier part 520 and toward a perimeter of the casing 505 before the first electrode 510 projects outside of the casing 505. In some embodiments, the plurality of leads 720, 725 and 726 of the first electrode are generally "h" shaped or backward "h" shaped. Further in some embodiments, the first and second electrodes 510, 515 are configured in a generally "H"-shaped formation, with two leads, e.g., first and second leads 720, 725, extending from the chip carrier part 520 in generally a first direction, and the third lead 726 and the lead portion 727 of the second electrode 515 extending generally in a second direction that is approximately opposite the first direction. In some instances, the first lead 720 and third lead 726 of the first electrode 510 are axially aligned and extend way from the chip carrier part at about 180 degrees relative to each other, while the first and second leads 720, 725 are generally parallel as they extend from the chip carrier part.

The chip carrier part 520 widens as the chip carrier part extends toward and into the first and second leads 720, 725. In some embodiments, the single contiguous piece 715 at the chip carrier part 520 may widen as it extends from the chip carrier part 520 toward a perimeter of the casing 505. The widening can include extension or wing portions 734 and 740. The width and/or length of the extension portions 734, 740 can depend on the size of the chip carrier part 520, the electronic element to be cooperated with the chip carrier part, heat dissipation capabilities of the first electrode 510, material of the first electrode and/or other such factors. In some implementations, an extension indentation 746 divides the first extension portion 734 into to first and second extension sections 735 and 737. The extension indentation 746 between the first and second extension sections 735, 737 of the first extension portion 734 is void of electrode material and has a width 784. The width 784 of the first extension portion can depend on many factors such as those described above. Further, the extension indentation 746, in some implementations, further aids in maintaining relative positioning of the first electrode 510 and/or maintaining the structural integrity of the surface mount device 500 as described below. The extension indentation 746 can be generally square, polygonal, circular, triangular, or other relevant shapes or combinations of shapes. The width 784 of the extension indentation 746, in some embodiments depending on intended implementation, is greater than about 0.3 mm, in some instances greater than about 0.4 mm, for example, 0.5 mm.

In some embodiments, the first extension section 735 of the first extension portion 735 narrows as it tapers toward a central axis 738 (indicated by the dotted line labeled with the reference number 738) along a first edge 750 extending toward and/or into the first lead 720. Similarly, the second extension section 737 of the first extension portion 735 narrows as it tapers toward the central axis 738 along a second edge 750 extending to the third lead 726. Further, the second extension portion 740 can narrow tapering toward the central axis of the first electrode 510 along a third edge 755 as chip carrier part 520 extends toward and/or into the second lead 725. As such, the first electrode 510 generally narrows as it splits into the first, second and third leads 720, 725, 726.

The first and second leads 720, 725 extend from the chip carrier part 520 and are separated by a lead gap, indentation, void area or opening 745. The lead gap 745 may, for example, be generally square, rectangular, trapezoidal, other polygonal shape, circular, oval or other relevant shape. The lead gap 745 has a width 748 that in some implementations is proportional to the width of the first and second leads 720, 725, the area of the chip carrier part 520, the electronic element anticipated to be utilized with the surface mount device 500, and/or other relevant factors. In some embodiments, the lead gap 745 has a width greater than about 0.5 mm, for example, about 0.7 mm+/−0.05 mm.

In some embodiments, the first lead 720 and/or second lead 725 of the first electrode 510 increase in width prior to projecting through the second surface 535 and outside of the casing 505 to first and second width 781 and 782, respectively. The first and second widths can be maintained as a constant width as the leads exit the casing and extend along the second and fourth surfaces of the casing. Typically, the first width 781 is about equal to the second width 782. The first and second widths 781, 782 are predefined widths based on one or more factors such as, the electronic element to be cooperated with the chip carrier part 520, the size of the casing 505, the lead gap 745 and/or other such factors. In some embodiments, the first and second leads 720, 725 maintain widths greater than about 0.35 mm, typically greater than about 0.4 mm, for example, greater than about 0.41 mm. In some implementations, the first and second leads 720, 725 widen to the first and second widths 781, 782 tapering away from the central axis 738 of the first electrode 510 along the first edge 750 and the third edge 755, respectively, prior to extending through the second surface 535 of the casing 505. The first and second widths 781, 782 can be dependent on many factors as described above, and in some implementations are greater than about 0.5 mm, for example, greater than about 0.7 mm.

In some implementations, the third lead 726 of the first electrode 510 that extends away from the chip carrier part 520 in a direction generally opposite the first lead 720 can also widen to a third width 783, tapering along the second edge 752 away from the central axis 738 widening the lead 726 to the third predefined width 783 prior to the third lead extending through the third surface 540 and outside of the casing 505. The third lead can maintain the width 783 as it extends along the third and fourth surfaces 540, 545 of the casing 505. The width can be dependent on one or more factors such as the electronic element to be cooperated with the chip carrier part 520, the size of the casing 505, material of the first electrode and/or other such factors. In some instances, the widths 781-783 are substantially equal. In some embodiments, the third lead 726 is configured to maintain a width greater than about 0.35 mm, typically greater than about 0.4 mm, for example, greater than 0.41 mm, and widens to width 783 that is greater than about 0.5 mm, for example, greater than about 0.7 mm.

The tapering along the first edge 750 toward the central axis 738 of the first extension section 735 and the tapering away from the central axis of the first lead 720 defines a first lead indentation 760 of the first electrode 510. Similarly, a second lead indentation 762 can be defined along the second edge 752 due to the tapering toward the central axis 738 of the second extension sections 737 and the tapering away from the central axis of the third lead 726, and a third lead indentation 765 can be defined along the third edge 755 due to the tapering toward the central axis 738 of the second extension portion 740 and the tapering away from the central axis of the second lead 725. In some implementations, the first, second and/or third lead indentations 760, 762, 765 can be generally trapezoidal in shape. Other shapes, however, can be employed, such as, but not limited to square, rectangular or other relevant shape.

The second electrode 515 includes a head end 742 that is positioned juxtaposed with the chip carrier part 520 of the first electrode 510 separated from the first electrode by the insulation gap. A lead 727 of the second electrode 515 extends from the head end 742 proximate the chip carrier part 520 toward and through the third surface 540 of the casing 505. In some implementations, the lead 727 is bent generally orthogonally at a first bend 707 and further bent generally orthogonally at a second bend 712, enabling the second electrode 515 to extend along portions of the third and fourth surfaces 540, 545 of the casing 505 to establish one or more external electrical connections. The second electrode 515 may be bent and/or arranged relative to the surface mount device 500 in other configurations as are known in the art for establishing an external electrical connection.

In some embodiments, a portion of the head end 742 of the second electrode 515 parallels or mimics an adjacent portion of the chip carrier part 520 of the first electrode 510. For example, edges of the head end can parallel at least a portion of edges of the second extension portion 740 and taper toward the central axis 738 paralleling a portion of an edge of the chip carrier part 520. The head end 742 narrows as the second electrode 515 extends away from the chip carrier part 520 toward the third surface 540 of the casing 505. The head end 742 can taper along a first edge 757 generally toward the central axis 738 extending into the lead portion 727 of the second electrode 515. The second electrode can further narrow along a second edge 758 away from the central axis 738. In some implementations, the narrowing along the second edge 758 is a substantially perpendicular narrowing. Prior to the lead portion 727 of the second electrode extending through the third surface 145 of the casing 505, the second electrode 515 widens to a width 785. The widening of the second electrode can be implemented by tapering the electrode along the first edge 757 away from the central axis 738. A lead indentation 767 is formed by the narrowing at the head end 742 and widening of the lead 727 along the first edge 757. In some embodiments, the indentation 767 is generally conical and/or trapezoidal in shape. In some implementations, the width of the lead 727 of the second electrode 515 is maintained to be greater than about 0.35 mm, typically greater than about 0.4 mm, for example, greater than 0.41 mm, while the width 785 in some implementations is greater than about 0.5 mm, for example, greater than about 0.7 mm.

The second electrode 515 is further positioned relative to the first electrode 510 such that the lead 727 of the second electrode is separated from the third lead 726 of the first electrode by a lead gap, inlet or void area 747. The lead gap 747 may, for example, be generally square, rectangular, trapezoidal, other polygonal shape, circular, oval or other relative shapes. In some embodiments, the lead gap 747 is maintained as the second electrode 515 and the third lead 726 of the first electrode 510 extend through and along the third surface 540 of the casing such that the second electrode and the third lead of the first electrode are generally parallel. The lead gap 747 can have dimensions, in some implementations, similar to those of the lead gap 745 with a width greater than about 0.5 mm, for example, about 0.7 mm+/−0.05 mm. Further, the distance between the lead gaps 745, 747 can define a chip carrier part length, that in some embodiments depending on intended implementation and/or electronic device to be incorporated can be greater than about 0.8 mm, and in some instances greater than about 1.0 mm, for example, about 1.2 mm.

The insulation gap 770 separates the chip carrier part 520 of the first electrode 510 from the head end 742 of the second electrode 515. The insulation gap 770 typically electrically isolates the first electrode 510 from the second electrode 515. The width and/or size of the insulation gap 770 can be substantially any relevant size and is typically dependent on the electrical and/or optoelectronic element to be coupled with the chip carrier part 520, the voltage, current and/or power level of operation of the surface mount device 500, the intended implementation of the surface mount device 500, the material of the first and second electrodes, other relevant factors or combinations of factors. In some embodiments, the insulation gap 770 has a width of between about 0.1 and 0.3 mm, for example about 0.2 mm+/−0.05 mm.

Figure 8:
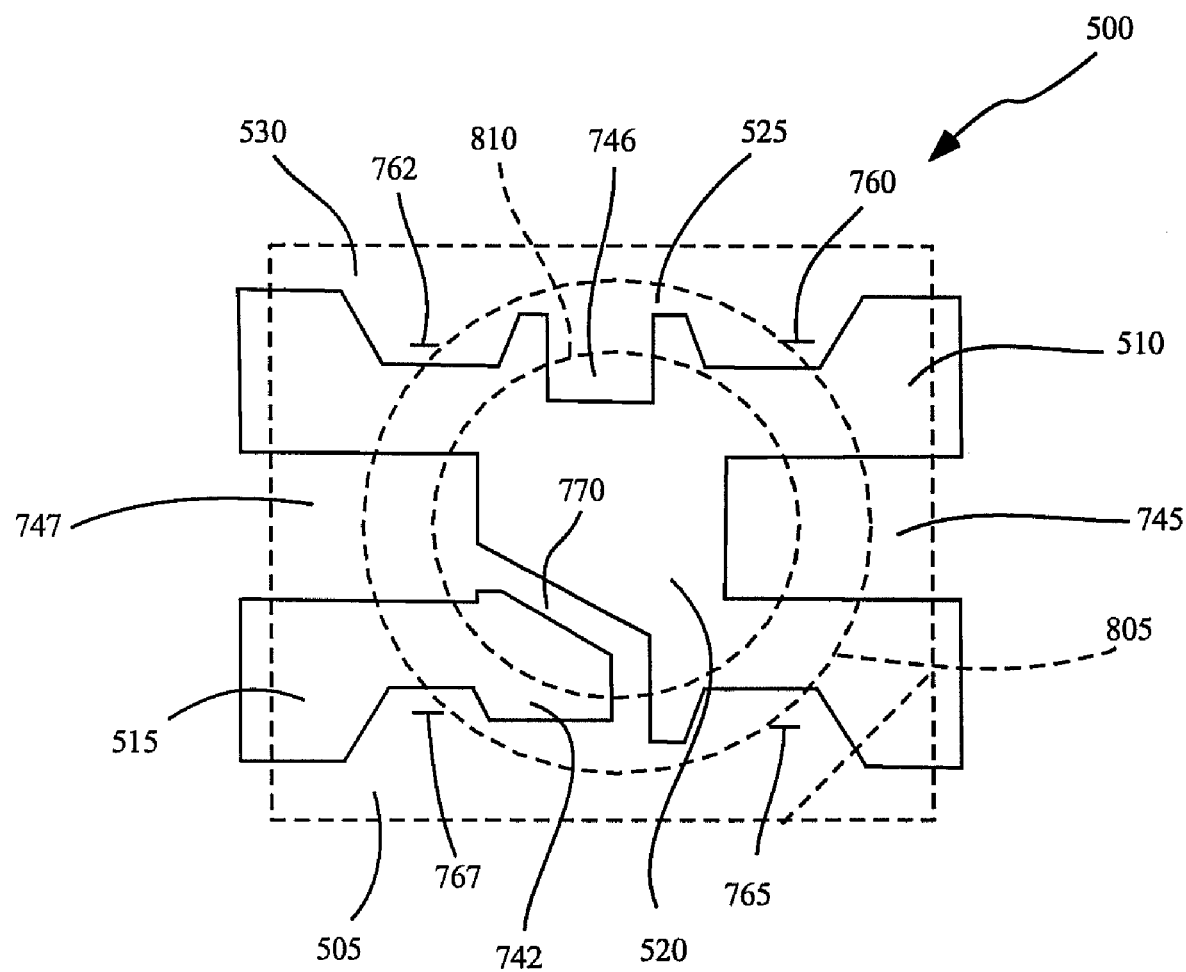
FIG. 8 depicts a transparent overhead view of the of the surface mount device of FIG. 5, illustrating the electrodes and the casing.

FIG. 8 depicts a transparent overhead view of the surface mount device 500, illustrating the first and second electrode 510, 515 positioned relative to the casing 505, according to some embodiments. The recess 525 is illustrated showing those portions of the first electrode 510 including those portions of the chip carrier part 520, and the second electrode 515 exposed through the recess according to some embodiments. The outer perimeter 805 of the recess 520 is defined by an intersection of the first surface 530 of the casing 505 and the recess 525. The interior perimeter 810 of the recess is defined by an intersection of the first and second electrode 510, 515 and the recess 525. Typically, those portions of the casing 505, first electrode 510 and second electrode 515 within the interior perimeter 810 is exposed through the recess 525. The embodiment of FIG. 8 depicts portions of the first and second electrode 510, 515, portions of the insulation gap 770, portions of the lead gaps 745, 747 and portions of the extension indentation 746 being exposed by the recess 525.

In some embodiments, a fill material (not shown) is added to the recess 525 to at least partially cover and/or fill one or more of the first electrode 510, the second electrode 515, the insulation gap 770, the lead gaps 745, 747 and the extension indentation 746. Extending portions of the lead gaps 745, 747 and the extension indentation 746 further increase the surface area of the casing 505 that is exposed through the recess 525 and to fill material incorporated into the recess. This increased surface area can enhance the bonding of the fill material with the casing and around the first and second electrodes 510, 515. Allowing fill material and/or casing material to extent through the lead gaps 745, 747, extension indentation 746 and/or insulation gap 770, enhances the stability of the positioning of the first and second electrodes 510, 515. For example, portions of the lead gaps 745, 747 can allow casing material to extend between and around the first and second electrodes to further fix the positioning of the electrodes relative to the casing, and further the fill material can extend through and/or around the first and second electrodes through the portions of the lead gaps 745, 747, extension indentation 746 and the insulation gap 770 that extend into and are exposed through the recess to still further fix the positioning of at least the chip carrier part 520 of the first electrode 510 and the head end 742 of the second electrode 515 relative at least to the recess 525. Other benefits and advantages are provided by the surface mount device 500, including some or all of those described above regarding bonding of casing material and fill material, stability and operability of surface mount devices gained by exposing at least portions of vacant regions, the methods of manufacturing as described above, and other benefits. Exposing portions of vacant regions (e.g., portions of the insulation gap 770, the lead gaps 745, 747, and extension indentation 746) through the recess 525 can aid in the stability and operability of the surface mount device 500. Further, vacant regions and areas around the perimeter of the electrodes encased by the casing 505 can provide further increased stability due at least in part to casing material, fill material and/or adhesive material extending through at least portions of the vacant regions and areas around the electrodes to stabilize the positioning of the electrodes relative to the casing and/or recess.

While the invention herein disclosed has been described by means of specific embodiments and applications thereof, numerous modifications and variations could be made thereto by those skilled in the art without departing from the scope of the invention set forth in the claims.

What is claimed is:

1. A surface mount device, comprising:
  a plurality of electrodes, wherein one of said electrodes comprises a first electrode comprising a chip carrier part, and wherein another of said electrodes comprises a second electrode disposed proximate to said chip carrier part and separated from said chip carrier part by an insulation gap; and
  a casing at least partially encasing a portion of said first electrode and a portion of said second electrode, said casing having a recess extending from a first surface of said casing into said casing such that at least a portion of said chip carrier part is exposed through said recess;

wherein said first electrode extends from said chip carrier part toward a perimeter of said casing and divides into a first plurality of leads, said plurality of leads joining into a single first lead portion having a first width before said first electrode projects outside said casing, maintaining said width outside said casing; and wherein said second electrode extends away from said chip carrier part and attains a second width prior to projecting outside said casing, maintaining said second width outside said casing.

2. The device of claim 1, wherein said first electrode is positioned relative to said casing such that a portion of said chip carrier part and a first portion of an aperture between said first plurality of leads extend into a perimeter of said recess and are exposed through said recess.

3. The device of claim 2, wherein casing material forming said casing extends through a second portion of said aperture that is not exposed through said recess.

4. The device of claim 3, further comprising a fill material disposed within at least a portion of said recess where at least a portion of said fill material extends into said first portion of the aperture.

5. The device of claim 1, wherein said first electrode widens as it extends from said chip carrier part toward the perimeter of said casing, narrows as it splits into said first plurality of leads, and widens as said first plurality of leads join into said first joined lead portion to said first width before said first electrode projects outside of the casing.

6. The device of claim 5, further comprising:
a first indentation along a first edge of said first electrode defined by the widening of said chip carrier part, the narrowing of said plurality of leads and the widening of said first joined lead portion; and
a second indentation along a second edge of said first electrode defined by the widening of said chip carrier part, the narrowing of said plurality of leads and the widening of said first joined lead portion.

7. The device of claim 1, wherein said insulation gap is formed by edges of said second electrode paralleling edges of said chip carrier part.

8. A surface mount device, comprising:
a first electrode comprising a chip carrier part;
a second electrode disposed proximate to said chip carrier part and separated from said chip carrier part by an insulation gap; and
a casing encasing a portion of said first electrode and a portion of said second electrode, said casing having a recess extending from a first surface of said casing into said casing such that at least a portion of said chip carrier part is exposed through said recess, wherein said casing material forming said casing extends through a second portion of said aperture that is not exposed through said recess, wherein said recess further comprises a fill material disposed within at least a portion of said recess where at least a portion of fill material extends into said first portion of the aperture;
wherein said first electrode is positioned relative to said casing such that a portion of said chip carrier part and a first portion of an aperture extend into a perimeter of said recess and are exposed through said recess, wherein said first electrode further extends from said chip carrier part toward a perimeter of said casing and divides into a first plurality of leads separated by an aperture as the first electrode extends from the chip carrier part toward the perimeter of the casing, said first plurality of leads joining into a single first lead portion having a first width before said first electrode projects outside said casing, maintaining said width outside said casing; and wherein said second electrode extends away from said chip carrier part and attains a second width prior to projecting outside said casing, maintaining said second width outside said casing, wherein said second electrode further comprises a second plurality of leads separated by an inlet and positioned relative to said casing such that a portion of said second plurality of leads and a first portion of said inlet extend into the perimeter of and are exposed through said recess wherein at least a portion of said fill material extends into said first portion of said inlet and said casing material extends through a second portion of said inlet not exposed by the recess.

9. A surface mount device, comprising:
a first electrode comprising a chip carrier part;
a second electrode disposed proximate to said chip carrier part and separated from said chip carrier part by an insulation gap, wherein said second electrode comprises a second plurality of leads each having a head positioned juxtaposed to said chip carrier part where an edge of each said head ends at the second plurality of leads parallel edges of said chip carrier part, and a portion of said chip carrier part extends between the head ends of said second plurality of leads; and
a casing encasing a portion of said first electrode and a portion of said second electrode, said casing having a recess extending from a first surface of said casing into said casing such that at least a portion of said chip carrier part is exposed through said recess;
wherein said first electrode extends from said chip carrier part toward a perimeter of said casing and divides into a first plurality of leads separated by an aperture as the first electrode extends from the chip carrier part toward the perimeter of the casing, said first plurality of leads joining into a single first lead portion having a first width before said first electrode projects outside said casing, maintaining said width outside said casing; and
wherein said second electrode extends away from said chip carrier part and attains a second width prior to projecting outside said casing, maintaining said second width outside said casing.

10. The device of claim 9, wherein said second plurality of leads join into a second joined lead portion, with said second electrode widening as said second plurality of leads join into said second joined lead portion before said second electrode projects outside said casing such that said second joined lead portion extends through a second surface of said casing.

11. A surface mount device, comprising:
a plurality of electrodes, wherein one of said electrodes comprises a first electrode comprising a chip carrier part and a plurality of leads extending away from said chip carrier part, wherein said plurality of leads comprises first and second leads extending generally parallel and in a first direction away from said chip carrier part, and a third lead extending away from said chip carrier part in a second direction substantially opposite said first direction, wherein said first electrode narrows as it extends into at least a first and second lead, wherein another of said electrodes comprises a second electrode positioned proximate to and extending away from said chip carrier part;
an insulation gap separating said second electrode from said first electrode; and
a casing that encases portions of said first and second electrodes, wherein the plurality of leads of said first electrode and said second electrode protrude through surfaces of said casing, the at least first and second leads of said first electrode widening to first and second widths of said predefined widths, respectively, prior to said at least first and second leads projecting outside said casing, said casing comprising a recess formed such that a portion of said chip carrier part is exposed through said recess.

12. The device of claim 11, wherein said first and second leads of said first electrode are separated by a first lead gap, and said third lead and second electrode are separated by a second lead gap, and said first and second electrodes are positioned relative to said casing such that said portion of the chip carrier part, a portion of said isolation gap, a portion of said first lead gap and a portion of said second lead gap extend into said recess and are exposed through said recess.

13. The device of claim 12, wherein said chip carrier part further comprises an extension portion and an extension indentation formed in said extension portion such that a portion of said extension indentation extends into the perimeter of said recess and is exposed through said recess.

14. The device of claim 13, further comprising:
a fill material filling at least a portion of said recess and extending into said portion of the insulation gap, said portion of the first lead gap, said portion of the second lead gap and said portion of the extension indentation that are exposed through said recess.

15. A surface mount device, comprising:
a first electrode comprising a chip carrier part;
a second electrode disposed at a distance from said chip carrier part; and
a casing encasing a portion of said first electrode and a portion of said second electrode, said casing comprising a recess extending from a surface of and into said casing such that at least a portion of said chip carrier part is exposed through said recess;
said first electrode extending from said chip carrier part toward a perimeter of said casing and projecting outside said casing;
said second electrode projecting outside said casing; and
said first electrode comprising a plurality of leads as said first electrode extends from said chip carrier part toward the perimeter of said casing, said plurality of leads having predefined widths before said plurality of leads project outside said casing and maintaining said predefined widths outside said casing, wherein said first electrode narrows as it extends into at least a first and second lead, the at least first and second leads widening to first and second widths of said predefined widths, respectively, prior to said at least first and second leads projecting outside said casing, and said second electrode attaining an additional predefined width prior to projecting outside said casing and maintaining said additional predefined width outside said casing.

16. The device of claim 15, wherein said first electrode and said second electrode in combination are generally H-shaped.

17. The device of claim 15, further comprising:
a first indentation along a first edge of said first electrode defined by the narrowing of said first electrode extending into said first lead and said first lead widening to said first width prior to projecting outside said casing, and a second indentation along a second edge of said first electrode defined by the narrowing of said first electrode extending into said second lead and said second lead widening to said second width prior to projecting outside said casing.

18. The device of claim 15, wherein said second electrode narrows as it extends away from said chip carrier part and widens to said additional predefined width before said second electrode projects outside said casing defining an indentation along a first edge of said second electrode.

* * * * *